US006377956B1

United States Patent
Hsu et al.

(10) Patent No.: US 6,377,956 B1
(45) Date of Patent: Apr. 23, 2002

(54) AUTOMATICALLY CONFIGURING PRODUCT MANUAL BY BINDING DOCUMENT OBJECTS IN LOGICAL STRUCTURE TO PROPER VERSIONS OF COMPONENT DOCUMENTS IN A DOCUMENT DATABASE

(75) Inventors: Liang-Hua Hsu, Robbinsville; Peiya Liu, East Brunswick, both of NJ (US); Tim Dawidowsky, Essen (DE)

(73) Assignee: Siemens Corporate Research, Inc., Princeton, NJ (US)

( * ) Notice: Subject to any disclaimer, the term of this patent is extended or adjusted under 35 U.S.C. 154(b) by 0 days.

(21) Appl. No.: 09/255,085

(22) Filed: Feb. 22, 1999

(51) Int. Cl.$^7$ ............................................. G06F 17/00
(52) U.S. Cl. ................... 707/104.1; 707/100; 707/102; 707/501; 707/513; 707/514; 707/907
(58) Field of Search ..................... 707/1–3, 100–104.1, 707/500–514, 515, 900, 907–908; 704/9–10, 500.1

(56) References Cited

U.S. PATENT DOCUMENTS

| | | | | | |
|---|---|---|---|---|---|
| 5,680,613 | A | * | 10/1997 | Atsumi ........................ 707/103 |
| 5,708,806 | A | * | 1/1998 | DeRose et al. .............. 707/104 |
| 5,740,425 | A | * | 4/1998 | Povilus ........................ 707/100 |
| 5,794,257 | A | * | 8/1998 | Liu et al. ..................... 707/501 |
| 5,799,268 | A | * | 8/1998 | Boguraev ...................... 704/9 |
| 5,875,441 | A | * | 2/1999 | Nakatsuyama .................. 707/1 |
| 5,884,315 | A | * | 3/1999 | Dunn .......................... 707/102 |
| 6,085,201 | A | * | 7/2000 | Tso ............................. 707/505 |
| 6,119,136 | A | * | 9/2000 | Takata et al. ................ 707/513 |
| 6,154,754 | A | * | 11/2000 | Hsu et al. .................... 707/513 |
| 6,182,095 | B1 | * | 1/2001 | Leymaster et al. ......... 707/515 |
| 6,185,587 | B1 | * | 2/2001 | Bernardo et al. ........... 707/513 |
| 6,205,455 | B1 | * | 3/2001 | Umen et al. ................ 707/513 |

FOREIGN PATENT DOCUMENTS

EP          0901072 A2 *  3/1999 ...................... 17/3

* cited by examiner

Primary Examiner—John Breene
Assistant Examiner—Srirama Channavajjala
(74) Attorney, Agent, or Firm—Donald B. Paschburg

(57) ABSTRACT

A system for automatically assembling product manuals based on a product model, a delivery model and a formal configuration specification includes a structure instantiator for instantiating a product manual structure from a model-specific configuration specification to create a logical structure for a product manual. The product manual structure incorporates product information from a product model, the product manual structure including document objects. A manual configurer is included for configuring the product manual by binding the document objects in the logical structure to proper versions of component documents stored in a document database. A manual generator is also included for generating the product manual by physically extracting the document objects from the document database to a directory, based on a delivery model. A method for automatically assembling product manuals is also included.

24 Claims, 9 Drawing Sheets

FIG. 4 configuration

"Volume" 3.5 "Major Inspection":
    "Volume Cover" 3501 "Cover Sheet",
    "Chapter" "General Information",
    "Chapter" "Guidelines",
    "Chapter" "Working Instructions",
    "Chapter" "Major Inspection Sequences",
    "Chapter" "Additional Documentation";

"Chapter" "General Information":
    ...

"Chapter" "Guidelines":
    "Section" 0236 "Minor Inspection Check List",
    "Section" 0238 "List of Corrective Measures for Minor Inspection",
    "Section" 0246 "Major Inspection Check List",
    ...

"Chapter" "Working Instructions":
    "Section" "Turbine/Compressor",
    "Section" "Combustion Chamber",
    "Section" "Lube and Control Oil System",
    ...

"Section" "Turbine/Compressor":
    "Document" 0450 "Field Balancing of Rotor",
    "Document" 0451 "Placing Balance Weights",
    "Document" 0452 "Rotor Support Jig and Rotor Removal",
    ...

work sequence

"Chapter" "Major Inspection Sequences":
    "Work Seq Sect" "Measurements Prior to Disassembly of Gas Turbine",
    "Work Seq Sect" "Remove Combustion Chamber",
    "Work Seq Sect" "Open Gas Turbine",
    ...

"Work Seq Sect" "Remove Combustion Chamber":
    "Work Inst" 5040 "Overview of Removing Combustion Chamber",
    "Work Sched" 5041 "Move Combustion Chambers away from Turbine Compressor",
    "Work Sched" 5042 "Disconnect Connecting Piping on Combustion Chambers",
    "Work Sched" 5043 "Disconnect Cable Connections to Combustion Chambers",
    "Work Sched" 5044 "Remove Combustion Chambers from Turbine Compressor";

...

FIG. 5 property

"Work Sched" 5042:
    { product_type=@product_database;
      task="Major Inspection";
      work_steps=042;
      major_parts=10501;
      minor_parts=90905,90951,90971;
      bill_of_materials=@product_database;
      schematics=;
      cad_drawings=;        };

...

AUTOMATICALLY CONFIGURING PRODUCT MANUAL BY BINDING DOCUMENT OBJECTS IN LOGICAL STRUCTURE TO PROPER VERSIONS OF COMPONENT DOCUMENTS IN A DOCUMENT DATABASE

BACKGROUND

1. Technical Field

This disclosure relates to product manuals and more particularly, to a system and method for assembling product manuals automatically based on product models.

2. Description of the Related Art

Due to the complexity and sophistication of technological products being manufactured and operated today, documentation which provides instructions and relevant technical information for properly operating and maintaining the products has become an integral part of the products. Product documentation includes a variety of product-related technical documents such as descriptions of machine parts, installation procedures, operation instructions, inspection schedules, maintenance records, etc. Compared to non-technical documentation, the contents and structures of product documents and technical documents are much more rigid and often comply to various industrial standards. There are three aspects of production documentation that may be further explored. First, a product type often includes a family of related product models, and they share a large percentage of common parts in the same family. Thus, technical documents for the common parts may be reused for the related product models. Secondly, product information is needed at different stages of the life cycle of a product from manufacturing and installation, to training, operation, and maintenance. Thus, a large portion of the technical documents can be reused in different contexts. Thirdly, technical documents tend to be highly cross-referenced, and often refer the users to many different forms of technical data including textual instructions, schematic diagrams, CAD drawings, photo images of machine parts, video of inspection procedures, etc.

As the products and the documents evolve in their own directions through time, a large number of models of products and a large number of versions of documents continue to be created and updated. The complexity of product documentation is thus dependent on the complexity of the products, the complexity of the documents, and the relationships between the products and the documents. To construct a multimedia manual for a specific product, which is composed of thousands of product documents together with thousands of schematic diagrams, CAD drawings, photo images, video and audio clips is really a major undertaking. In particular, product documents in all different media are prepared and processed for all machine parts of all product models in all product families by many authors and engineers on their own machines in different departments throughout an organization. Based on the configuration of a product, versions of the component documents, including versions of all related diagrams, images, drawings, etc., are selected, formatted and assembled into multiple volumes of a multimedia product manual. Thus, building a highquality product manual is a very time-consuming process, and ensuring the correctness of all the contents and the consistency with the customer's product is even more tedious, if not impossible.

Therefore, a need exists for a system and method for automatically assembling multimedia technical manuals for large-scale, complex products and services. A further need exists for a system and method for updating and maintaining such manuals as well.

SUMMARY OF THE INVENTION

A system for automatically assembling product manuals based on a product model, a delivery model and a formal configuration specification includes a structure instantiator for instantiating a product manual structure from a model-specific configuration specification to create a logical structure for a product manual. The product manual structure incorporates product information from a product model, the product manual structure including document objects. A manual configurer is included for configuring the product manual by binding the document objects in the logical structure to proper versions of component documents stored in a document database. A manual generator is also included for generating the product manual by physically extracting the document objects from the document database to a directory, based on a delivery model.

In alternate embodiments, the configuration specification may include sections for representing relationships in the logical structure. The configuration specification sections may include a configuration section for specifying the logical structure of the product manual in terms of composition relationships of the document objects, a work sequence section for specifying a list of operational work steps in terms of composition relationships between work steps, a property section for specifying characteristics of the document objects in the logical structure, a binding section for specifying a current binding status between the document objects in the logical structure and physical document files and/or an unknown section for specifying unbound document objects and for listing the document objects to identify missing documents and identify a need to create new documents. The configuration specification preferably supports incremental composition for updating and maintaining the document objects and the product manual.

The instantiator may include a file structure builder for setting up a working environment on a file structure, the file structure including files related to the product which are copied from the document database in accordance with the delivery model. A configuration template identifier may be included for identifying and retrieving a model-specific configuration template from the document database, the model-specific configuration template for integrating information into a model-specific manual structure for the product manual. A model-specific manual structure creator may be included for parsing the model-specific manual structure to create an internal structure and for automatically validating the internal structure against product information in a product database. A machine-specific manual structure creator may be included for creating a machine-specific manual structure by incorporating machine-specific and customer-specific requirements into the model-specific manual structure, and a configuration specification generator may be included for generating a machine-specific configuration specification from the machine-specific manual structure with the properties and binding status of all the document objects.

The manual configurer may further include a model-specific document binder for binding model-specific document objects in a machine-specific product manual structure to physical document files in the document database, a machine-specific document generator for extracting machine-specific product information from the document database and generating machine-specific documents for the document objects in the machine-specific product manual structure. A machine-specific document binder may be included for binding machine-specific document objects in the machine-specific product manual structure to physical document files in the document database. A product document promoter may also be included for promoting machine-specific documents to model-specific documents for a product model. A similar document finder may be included for identifying similarities between the documents in the document database and the document objects in a machine-specific product manual structure to determine if the existing documents are reusable. The manual configurer may further included a configuration generator for capturing a current state of assembling the machine-specific product manual, and generating a machine-specific configuration to support incremental composition and an unknown list generator for generating a list of unbound document objects in the machine-specific product manual structure.

In still other embodiments, the manual generator may further include a component document retriever for retrieving the component documents from the document database, based on a machine-specific configuration, and the component document retriever for storing the component documents in various subdirectories of a machine-specific directory, based on the delivery model and a document evaluator for evaluating the retrieved component documents to convert the retrieved component documents into machine-specific documents. The manual generator may also include a document transformer for transforming the structure of the retrieved component documents into a target document structure for the machine-specific product manual, based on a document structure transformation specification and a supporting multimedia retriever for retrieving multimedia files associated with the retrieved component documents for the machine-specific product manual. The manual generator may still further include a machine-specific product manual generator for generating top-level standard generalized markup language (SGML) documents to complete the machine-specific product manual, including one or more of a table of contents, work sequence lists, a glossary and an index and a presentation style retriever for retrieving presentation styles for the machine-specific product manual structure, based on the delivery model.

The formal configuration specification may include a product manual configuration specification language (PMCSL). The document objects preferably include at least one of drawings, diagrams, text, photographs, video, animation and audio.

A method for automatically assembling product manuals based on a product model, a delivery model and a formal configuration specification includes the steps of instantiating a product manual structure from a model-specific configuration specification to create a logical structure for a product manual, the product manual structure incorporating the product information from a product model, the product manual structure including document objects; configuring the product manual by binding the document objects in the logical structure to proper versions of component documents stored in a document database; and generating the product manual by physically extracting the document objects from the document database to a directory, based on a delivery model.

In other methods, the configuration specification may include sections and the method may further include the step of representing relationships in the logical structure using the sections. The method may further include the step of specifying the logical structure of the product manual in terms of composition relationships of the document objects using a configuration section, specifying a list of operational work steps in terms of composition relationships between work steps using a work sequence section, specifying characteristics of the document objects in the logical structure using a property section, specifying a current binding status between the document objects in the logical structure and physical document files using a binding section and/or specifying unbound document objects using an unknown section and listing the document objects to identify missing documents and identify a need to create new documents using the unknown section. In still other methods, the method may further include the step of updating and maintaining the document objects and the product manual.

The step of instantiating may further include the steps of setting up a working environment on a file structure, the file structure including files related to the product which are copied from the document database in accordance with the delivery model; identifying and retrieving a model-specific configuration template from the document database, the model-specific configuration template for integrating information into a model-specific manual structure for the product manual; parsing the model-specific manual structure to create an internal structure and for automatically validating the internal structure against product information in a product database; creating a machine-specific manual structure by incorporating machine-specific and customer-specific requirements into the model-specific manual structure; and generating a machine-specific configuration specification from the machine-specific manual structure with the properties and binding status of all the document objects.

The step of configuring may further include the steps of binding model-specific document objects in a machine-specific product manual structure to physical document files in the document database; extracting machine-specific product information from the document database and generating machine-specific documents for the document objects in the machine-specific product manual structure; binding machine-specific document objects in the machine-specific product manual structure to physical document files in the document database; promoting machine-specific documents to model-specific documents for a product model; identifying similarities between the documents in the document database and the document objects in a machine-specific product manual structure to determine if the existing documents are reusable; capturing a current state of assembling the machine-specific product manual, and generating a machine-specific configuration to support incremental composition; and generating a list of unbound document objects in the machine-specific product manual structure.

The step of generating may further include the steps of retrieving the component documents from the document database, based on a machine-specific configuration, and the component document retriever for storing the component documents in various subdirectories of a machine-specific directory, based on the delivery model; evaluating the retrieved component documents to convert the retrieved component documents into machine-specific documents; transforming the structure of the retrieved component documents into a target document structure for the machine-specific product manual, based on a document structure transformation specification; retrieving multimedia files associated with the retrieved component documents for the machine-specific product manual; generating top-level standard generalized markup language (SGML) documents to complete the machine-specific product manual, including one or more of a table of contents, work sequence lists, a glossary and an index; and retrieving presentation styles for the machine-specific product manual structure, based on the delivery model.

The formal configuration specification may include a product manual configuration specification language (PMCSL). The document objects may include at least one of drawings, diagrams, text, photographs, video, animation and audio.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 4 depicts a configuration section for a configuration specification in accordance with the present invention;

FIG. 5 depicts a work sequence section for a configuration specification in accordance with the present invention;

DETAILED DESCRIPTION OF PREFERRED EMBODIMENTS

Figure 1:
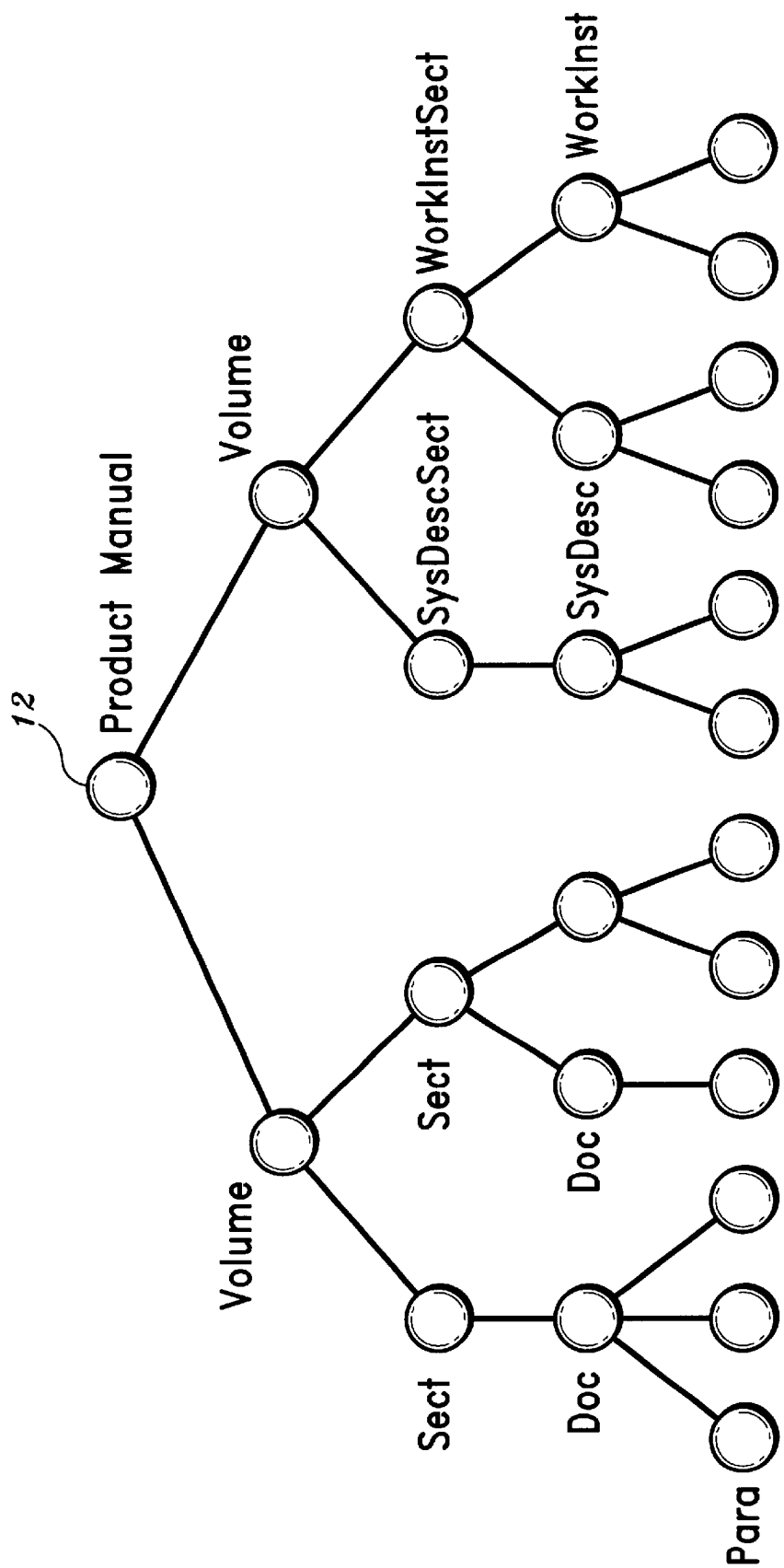
FIG. 1 depicts a hierarchical product manual structure in accordance with the present invention.

This disclosure relates to product manuals and more particularly, to a system and method for assembling product manuals automatically. The present invention automatically assembles multimedia technical manuals for large-scale, complex products and services. However, small-scale products and services are also covered by the invention. For simplicity, any reference hereinafter to products and product documents includes services and service documents, respectively. Further, the product manuals are preferably hierarchical. Therefore, the description of the invention herein will be described in terns of two levels a model level (model-specific) and a machine level (machine-specific. Other level types, amounts and names are contemplated and may be implemented by the present invention.

One method in accordance with the invention is referred to as Automatic Product Manual Composition, it makes use of product information from a product database and component documents from the document database to generate highly customized technical manuals for specific products, referred to as machine-specific product manuals.

The present invention is preferably based on Standard Generalized Markup Language (SGML). SGML separates the contents of the documents from the presentation styles, and is the basis to support content composition of several volumes of documents in a hierarchical structure preferably for a large-scale, complex product. On top of SGML, the invention provides a Product Manual Configuration Specification Language (PMCSL) for an author to describe the logical structure of a product manual, and the relationships between the document objects of the product manual and the parts of the product model. It also provides mechanisms to automate all aspects of the process of building machine-specific product manuals, including validating machine-specific manual structures, generating machine-specific documents, associating document objects to physical document files, identifying reusable documents, evaluating and transforming machine-specific documents, retrieving related multimedia data and generating a complete multimedia product manual.

Traditional document composition places more emphasis on arranging the components of a single document on a specific layout for printing. On the other hand, the SGML-based method in accordance with the present invention supports content composition of several volumes of documents in a hierarchical structure for a large-scale, complex product. In an SGML-based approach, the detailed layout of individual documents may be handled separately by SGML transformations and style specifications. Thus, during the product manual composition process, the authors may concentrate on the technical contents of the product documents, and ultimately, a more efficient and effective authoring process is achieved.

The present invention provides a specification language, referred to as Product Manual Configuration Specification Language (PMCSL), for the author to describe the logical structure of a product manual, and the relationships between the document objects of the product manual and the parts of the product model. A product manual configuration specification is used to keep track of the configuration of a product manual at the document object level. Based on the configuration specification of a product, the invention provides mechanisms to automate all aspects of the process of building machine-specific product manuals, including validating the machine-specific manual structure, generating machine-specific documents, associating document objects to physical document files, identifying reusable documents, evaluating and transforming machine-specific documents, retrieving related multimedia data and generating a complete multimedia product manual.

Product Manual Structures

A multimedia product manual includes a set of related product documents, organized in a structured manner to facilitate browsing. A product manual may be as simple as a collection of schematic diagrams and/or CAD drawings to support manufacturing tasks at the early stages of a product, or as complex as a complete manual set with product documents in all media, including textual documents, schematic diagrams, CAD drawings, photo images of machine parts, video clips of service procedures, audio tracks etc., to support operation and maintenance of the product. A multimedia product manual may be organized as a structure of product information for the customers, or may be organized as a reference to on-line, up-to-date technical information for the engineers.

In general, a multimedia product manual is a hierarchical structure of document objects. It should be understood that the elements shown in the FIGS. may be implemented in various forms of hardware, software or combinations; thereof. Preferably, these elements are implemented in software on one or more appropriately programmed general purpose digital computers having a processor and memory and input/output interfaces. Referring now to the drawings in which like numerals represent the same or similar elements and initially to FIG. 1, an example of a hierarchical product manual structure is shown. Document objects are shown as circles in a hierarchical tree. Documents objects may include a plurality of different multimedia types. Some document objects, for example, are actually physical document files, referred to as product documents. This depends on the characteristics of the authoring tools and the document databases that are used to create and maintain the documents. A product manual 12 may be divided into document objects in many ways. In this example, the document objects are product documents or product document files as shown FIG. 1. In general, a product document is a unit of product information that may be easily manipulated by authoring tools and authors. Product documents are component documents that are classified and assigned with identification (id) and properties, and are stored in a document database. A component document may be related to other component documents and media files in the document database. Media files, which are also document objects, are also managed in the same way as component documents. Component documents and component media may be stored separately as files in file directories or stored directly as blocks in database tables, or objects in archives in a document management system. In any case, database tables and external files are used to store the information of the component documents to support the applications.

Component documents are preferably represented in SGML (See SGML: Standard Generalized Markup Language, ISO/IEC 8879:1986). SGML is a meta-language for defining document structures, referred to as Document Type Definition (DTD). An SGML document structure is an instance of its associated DTD. Conceptually speaking, the structure of an SGML document is an upside-down tree that is composed of SGML elements (or more generally, document objects). An SGML element is thus either a leaf object whose content is the actual text (or any data code), or an interior object whose content is an SGML sub-structure, in addition to any possible text (or code). An SGML element is also associated with a list of attributes, e.g., id., type, name, etc. which provide additional information to characterize the element. An SGML document structure may also be divided into SGML files in many ways to facilitate editing and maintenance. An SGML-based product manual structure is the basis for constructing a multimedia product manual. That is, the author maps the product manual structure into an SGML-based product manual structure and manipulates the SGML-based structure for a specific product. Once a version of the SGML-based product manual structure is completed, for example the structure as shown in FIG. 1, the author searches for correct versions of the SGML files for all document objects in the document database. If necessary, the author creates new SGML files for new document objects in the product manual structure, or converts existing or new documents from other sources such as MS Word™, Interleaf™ and Framemaker™ into SGML. For each component document, the author also prepares for all needed multimedia files for diagrams, images, drawings, etc. in some standard formats such as CGM, TIFF, GIF, etc., which may be incorporated in the SGML files. When all SGML-based component documents together with all related multimedia files in the standard formats are prepared and attached to all document objects in the product manual structure, the author is ready to make a multimedia manual for the product in accordance with the invention. An SGML-based product manual structure is similar to a table of contents that is used as the basis for creating a product manual in the traditional process. However, the product manual structure is represented more explicitly in SGML, and thus, the product manual composition process may be automated more efficiently and effectively.

Automatic Product Manual Composition

Product manual composition is a configuration process that assembles a set of related product documents such as installation procedures, operation instructions, inspection schedules, etc. from a repository of component documents. In the media preparation process, all source documents are processed and converted into standard formats, in particular, SGML, and are stored in the document database. Automatic product manual composition is one important step in building a complex product manual, i.e., it starts by resolving the versions of the component documents in the document database, based on the product model and the configuration specification, then it extracts the needed documents and organizes them in a proper structure for the product manual.

Figure 2:
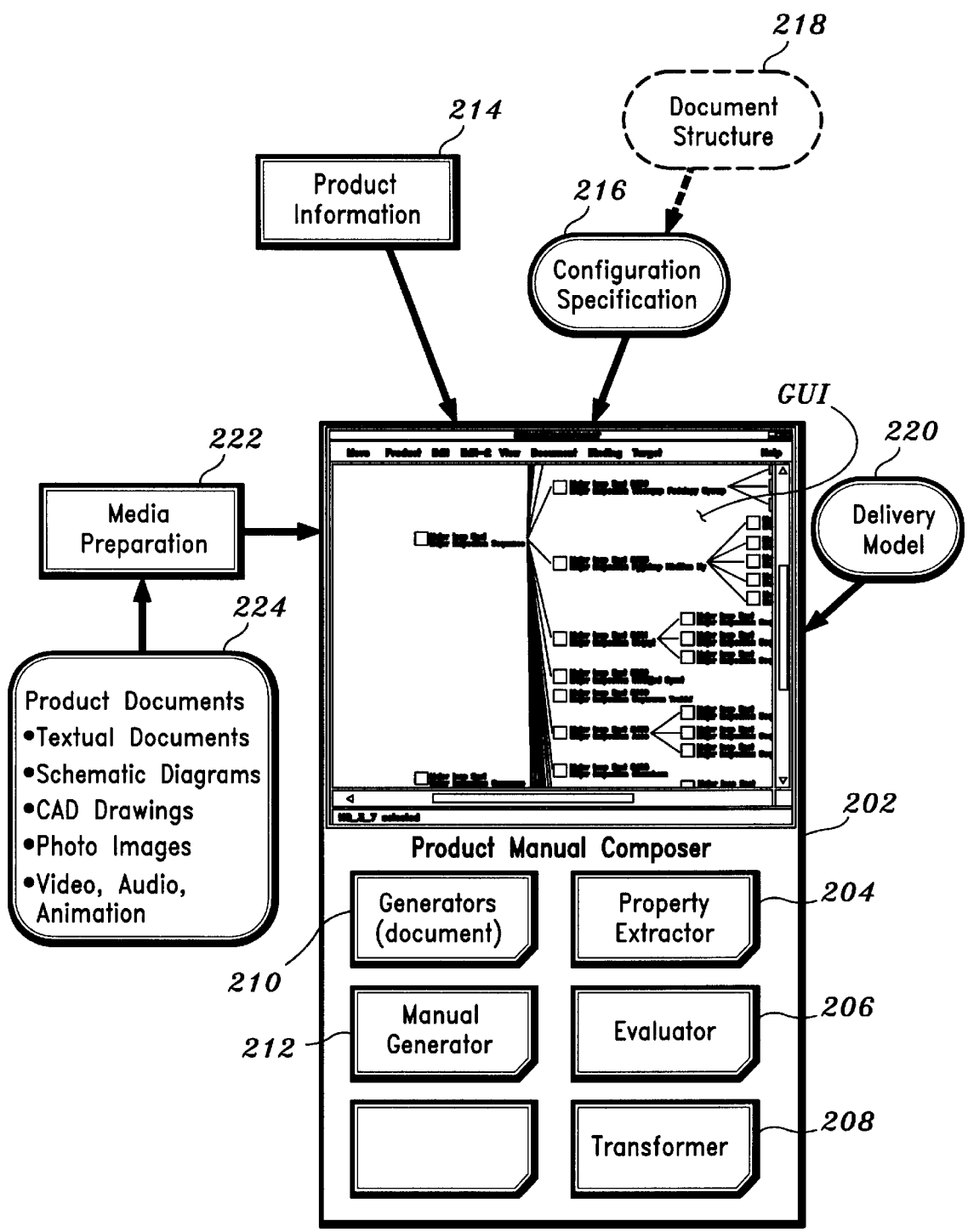
FIG. 2 is block diagram of a system for automatically assembling product manuals in accordance with the present invention.

Referring to FIG. 2, an illustrative automatic product manual composition system is shown. The product manual composition system includes a product manual composer 202 and a set of supporting tools which may include a document property extractor 204, a document evaluator 206, a document transformer 208, document generators 210, and a product manual generator 212.

The product manual composer 202 implements the automatic product manual composition process, and controls the execution of all other supporting tools. That is, it takes as input the product information from a product/document database 214 (including all product customization) and a configuration specification 216 (including all documentation customization input from document structure 218) to assemble a machine-specific product manual from the component documents in the document database, and generates as output an SGML-based product manual based on a delivery model 220. A delivery model describes a needed file directory structure for a target document delivery platform (e.g., UNIX®, personal computer, etc.). The product manual composer 202 provides a graphical user interface (GUI) for the author to create and edit the configurations of product manuals for all products, product models, and product families. It supports typical operations for manipulating the product manual structure graphically, e.g., the author can modify the product manual structure by moving document objects around, adding new document objects, and removing existing document objects to meet the customer's specific requirements. In general, the behavior of the product manual composition process is completely controlled by a product model, a configuration specification, and a delivery model, and is thus independent of any specific products, numbering schemes, etc.

A media preparation block 222 converts product documents to a useful format, for example, all document are converted to document objects. Product decedents are provided from a database 224. Product documents may include text, schematics, CAD drawings, photographs, video, audio, animation, etc.

Figure 3:
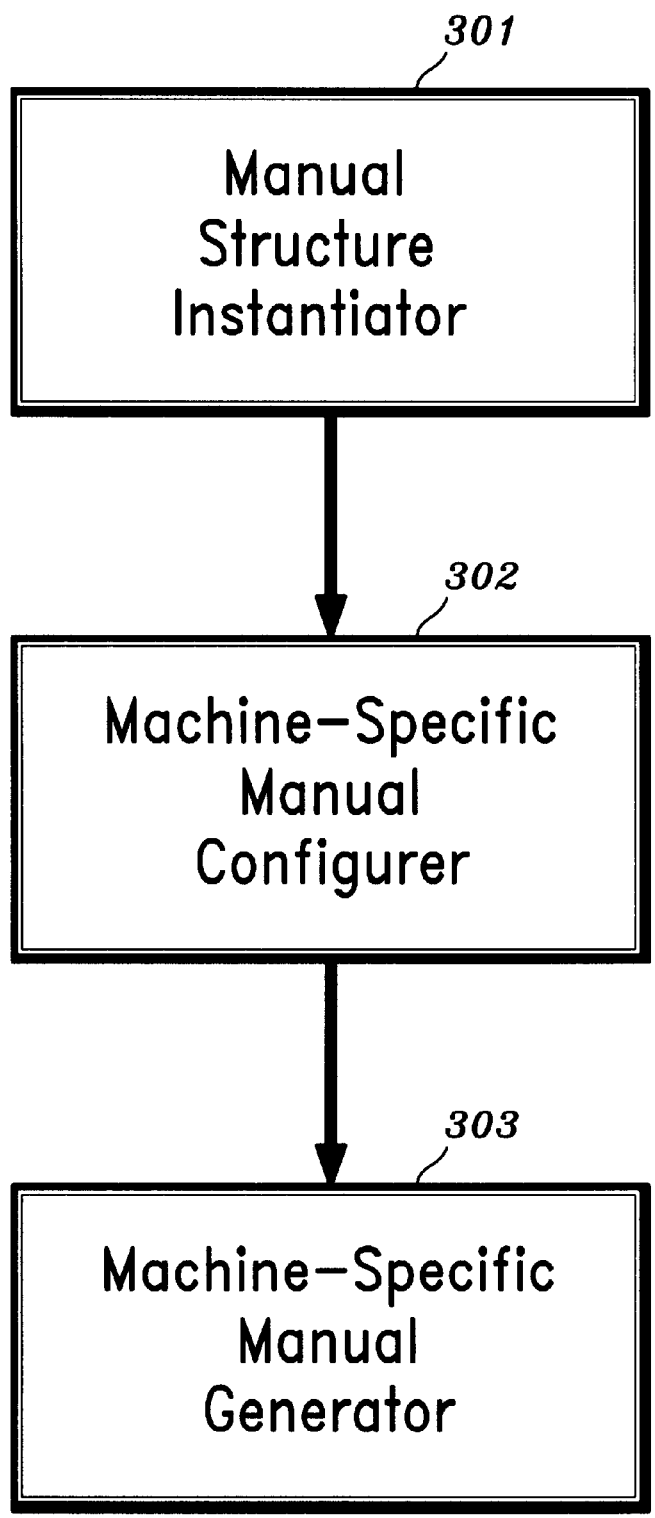
FIG. 3 is a block/flow diagram for product manual composition in accordance with the present invention.

Referring to FIG. 3, the product manual composition process includes three steps. In block 301, a first step includes instantiating a product manual structure. In block 302, a machine-specific manual structure is configured. In block 303, a machine-specific product manual is generated. The process flow starts with automatically creating an initial SGML-based product manual structure in block 301, based on the generic configuration that is valid for the product model of the product. The logical structure of a product manual is composed of document objects as specified in the configuration specification, and the logical structure may be manipulated and validated by the author. After the logical structure is completed, in block 302, the document objects in the logical structure are bound to SGML document files and multimedia files in the document database, documents that are entirely based on product information may also be generated automatically. For new products, the document database is searched for reusable documents, otherwise, new documents are created and entered into the document database by the authors. After all document objects are bound, in block 303 all SGML component documents and multimedia files are physically extracted from the document database and stored into a machine-specific file structure.

If necessary, component documents are evaluated and transformed into machine-specific documents. Auxiliary SGML documents such as table of contents are generated automatically, and presentation styles are installed properly in the machine-specific file structure. A multimedia product manual is assembled and ready for on-line browsing and further processing such as hyperlinking.

The present invention includes an automatic system for assembling product manuals based on a formal configuration language (PMCSL). This system includes:

(a) a Manual Structure Instantiator 301 for instantiating a product manual structure from a model-specific configuration specification to create a logical structure of a product manual, for incorporating the product information from a product model;

(b) a Machine-Specific Manual Configurer 302 for configuring a machine-specific product manual by binding all document objects in the logical manual structure to the proper versions of the component documents in a document database; and (c) a Machine-Specific Manual Generator 303 for generating a machine-specific product manual by physically extracting all document objects from the document database to machine-specific directory, based on a delivery model.

Configuration Specifications

The Product Manual Configuration Specification Language (PMCSL) is provided for the author to describe the logical structure of a product manual, and the relationships between the document objects of the product manual and the parts of the product model. A generic configuration specification that includes no customization information serves as a configuration template for a product manual of a product model. A product model includes product information such as part numbers, bill-of-material id's, CAD drawing id's, etc., and the relationships between the pieces of the product information. Product information is usually extracted from a product database such as a commercial product database, and stored in the document database for the purpose of Generating product manuals. In this disclosure, the term "product database" refers to the product information downloaded from the document database. Product information may be used to identify the model of a product. If a product is customized to meet specific customer's requirements, the product database may also include product customization information. The present invention will now be described by way of a non-limiting example for a complex product such as a gas turbine. Other products and services are contemplated in accordance with the present invention.

A configuration specification 216, for the present illustrative example, may include several sections, namely, "configuration", "work sequence", "property", "binding" and "unknown". Other sections may be added or substituted as desired. The "configuration" section includes the structure of a product manual, which is a hierarchical structure of document objects, and is specified as a list of composition relationships between document objects. An example of a list of composition relationships between document objects is shown in FIG. 4 where a volume includes chapters which in turn include sections, etc. A document object represents a component document, which may be a document file, a block of binary or ASCII code retrieved from the document database, etc. The id of a document object may include three parts: (1) document type, e.g., "Volume", "Chapter", "Section", etc.; (2) document number, e.g., 3.5 (a volume number), 0246 (a major inspection number), etc.; and (3) document description, e.g., "Guidelines", "Combustion Chamber", etc. Any combination of these three parts that forms a unique id. is sufficient for identifying a document object and for retrieving and updating the corresponding component document in the document database.

The "work sequence" section, in this example, includes a list of work sequences such as assembly procedures, inspection procedures, etc. that provide step-by-step instructions to guide the users to perform maintenance work on the products. Each work sequence includes a list of work steps or work schedules. As shown in FIG. 5, an example of the break-down of a work sequence is illustratively shown. The specification of work sequences is the same as that of the product manual structure, i.e., the specification of work sequences describes the composition relationships between the document objects that represent the work instructions and work schedules. In the product manual composition process, the work sequences are part of the product manual structure, i.e., the documents corresponding to the work instructions and work schedules are included as part of the product manual. However, the work sequences are specified separately, so that additional processing may be performed to make use of the work sequences, e.g., a list of the work sequences may also be generated automatically to be included in the product manual. The "configuration" and "work sequence" sections together define the logical structure of a product manual.

The "property", "binding" and "unknown" sections include information for the document objects in the product manual structure. The information of the document objects is used and updated in the process of configuring a machine-specific product manual.

To summarize, configuration specifications may include the following sections. A "configuration" section specifies the structure of a product manual in terms of composition relationships of document objects. A "work sequence" section specifies a list of operational work steps in terms of composition relationships between work steps. A "property" section specifies the characteristics of the document objects in a product manual structure. A "binding" section specifies the current binding status between documents objects in a product manual structure and physical document files. And, an "unknown section specifies the current unbound document objects. This list of objects can be printed out and examined by document authors to identify the missing documents and create new documents.

Instantiating a Product Manual Structure

Figure 6:
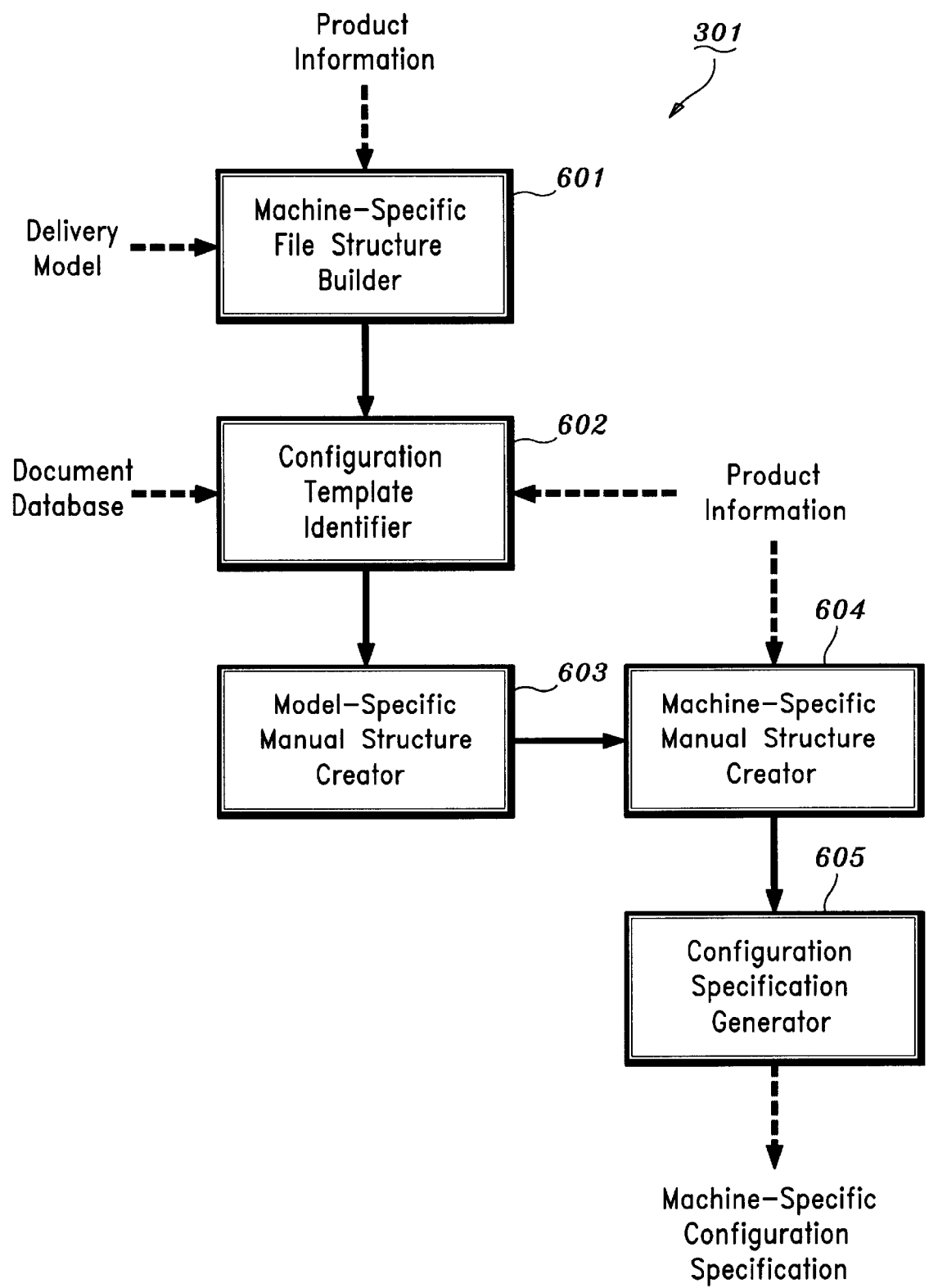
FIG. 6 is a block/flow diagram for instantiating a product manual structure in accordance with the present invention.

Referring to FIG. 6, a process for instantiating a product manual structure is shown for block 301 of FIG. 3. To construct a logical structure for a multimedia manual for a product, in block 601, a machine-specific working environment is first set up properly on the file structure. The purpose of the product manual composition process is to selectively copy documents from the document database to the machine-specific file structure. A delivery model represents the working environment of a delivery platform in which a product manual is browsed by SGML document browsers or further processed by other tools. A delivery model is represented by a list of parameters, which are specified in a target definition file.

After a machine-specific file structure is created, based on the product information such as product model, machine variants, etc., in block 602, a configuration template is retrieved from the document database, which includes a product manual structure and all work sequences, properties and bindings for all products of that particular product model. In a product manual that includes maintenance tasks, work sequences are integrated into the product manual structure at the proper locations as described in the configuration specification. In block 603, the model-specific structure is parsed and an internal structure is created to facilitate further processing. In particular, in block 603, the model-specific structure (as opposed to machine-specific) is automatically checked against the product information in the product database, e.g., machine part ids, bill-of-materials, schematic diagram ids, CAD drawing ids, etc. In block 604, the author may interactively revise the product manual structure to incorporate any machine-specific and customer-specific requirements. In block 605, from a revised and completed machine-specific product manual structure, a machine-specific configuration specification is generated and stored in the machine-specific file structure for further processing. From this point on, most of the product manual composition processes are based on the machine-specific configuration specification and other information installed in the machine-specific file structure. That is, all composition-related tools always try to use the information in the machine-specific file structure first, then look for the model-specific information in the document database.

For creating a machine-specific manual structure, an instantiation system includes the following. A Machine-Specific File Structure Builder 601 for setting up a machine-specific working environment on the file structure, based on a delivery model, for configuring a machine-specific product manual. A Configuration Template Identifier 602 for identifying and retrieving a model-specific configuration template from the document database. A Model-Specific Manual Structure Creator 603 for parsing a model-specific manual structure to create an internal structure and automatically validate the structure against the product information in the product database. A Machine-Specific Manual Structure Creator 604 for creating a machine-specific manual structure by incorporating machine-specific or customer-specific requirements to the model-specific manual structure. The system further includes a Configuration Specification Generator 605 for generating a machine-specific configuration specification from the machine-specific product manual structure with the properties and binding status of all document objects.

Configuring a Machine-Specific Product Manual

After a logical, machine-specific product manual structure is completed, the next step is to search for proper versions of the physical documents for all document objects in the product manual structure. The configuration template that was used to create a machine-specific structure for a product also includes information for binding model-specific document objects to physical document files.

Figure 7:
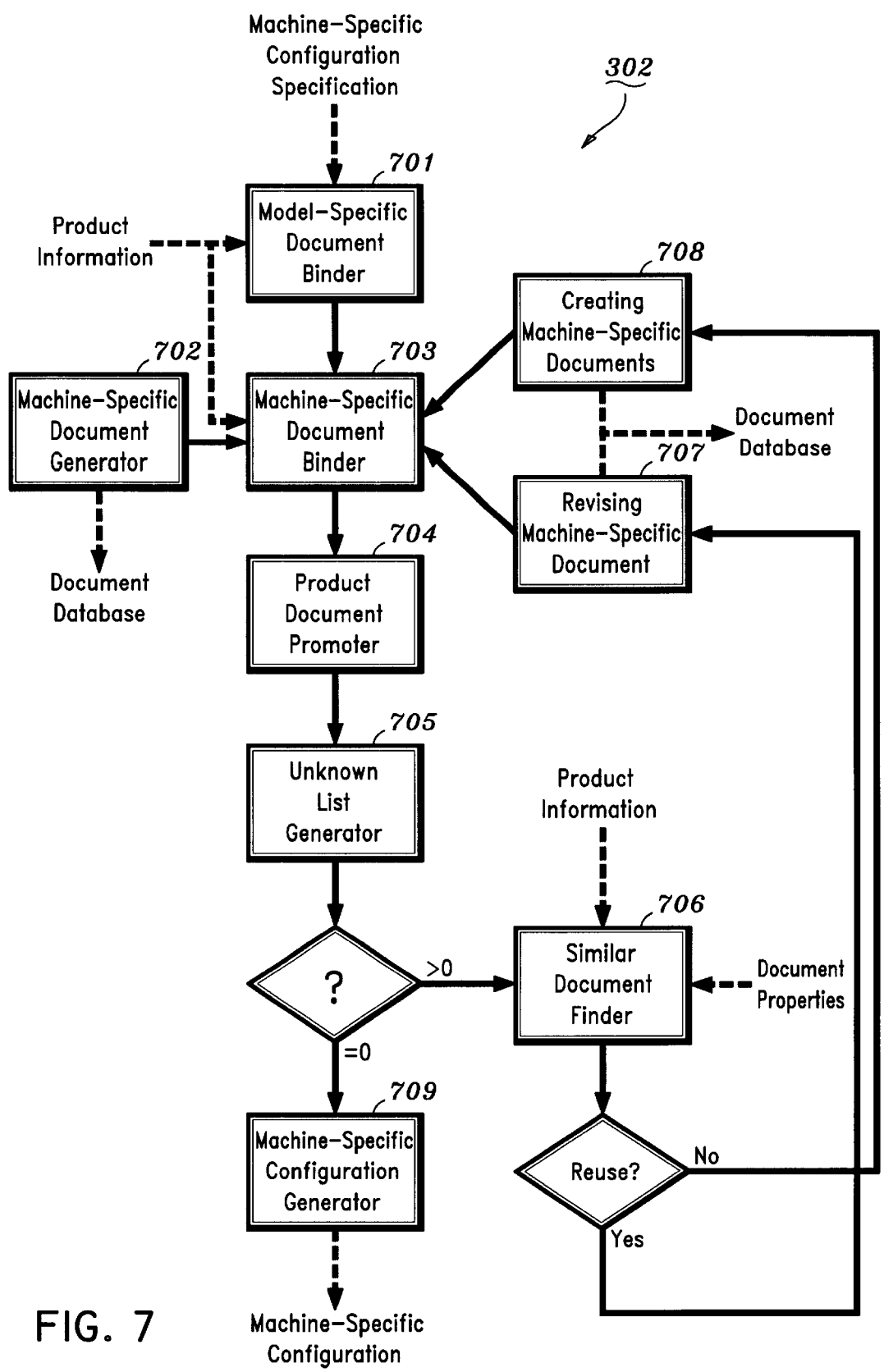
FIG. 7 is a block/flow diagram for configuring a machine specific manual in accordance with the present invention.

Referring to FIG. 7, configuring is performed as in block 302 of FIG. 3, in block 701, model-specific binding information is reused for the product manual under processing. There are documents in a product manual, which are completely based on the product information in the product database, and are preferably generated automatically by various SGML document generators. However, for large-scale, complex products such as gas turbines, not all products that belong to the same product model are identical, so the document generators 210 are invoked in block 702 to generate machine-specific SGML documents from the product database. For gas turbines, SGML documents that are generated automatically may include a List of Measuring Equipment, a List of Control Settings, a List of Electrical Loads, a Spare Parts Lists, etc.

Once all necessary machine-specific documents from the product database are generated, the process continues with machine-specific bindings in block 703. The author may also interactively edit machine-specific binding information based on input from product development, for example. The document binding process makes use of the binding information from the generic configuration of the product model, and any existing binding information available for the product in the document database. For example, a document object such as 0246 Major Inspection Check List will be bound to a physical document such as 3.5-0246-9423, i.e., a physical document of major inspection check list (0246) for the major inspection (5) of V94.23 (product model) of gas turbine (3). The id. of a physical document thus includes four parts: (1) product family, e.g., 3 is for gas turbine; (2) purpose of a volume of a product manual, e.g., 5 is for major inspection; (3) function, e.g., 0246 Major Inspection Check List, which is often the same as the document number of a document object to make it easy to identify; and (4) product model, e.g., V94.23, or a specific product number such as 0336, if the document includes specific customization information.

The document binding process involves assembling product documents from multimedia sources, including SGML text documents, in-line graphics, schematic diagrams, CAD drawings, photo images, video clips, etc. Thus, after all document objects in a product manual structure are bound successfully to some multimedia documents in the document database, a multimedia product manual is assembled successfully. In some cases, document bindings found during the process of configuring a machine-specific product manual may be reused for other products in the same product model. In block 704, the author may choose to "promote" such machine-specific bindings to be model-specific bindings for the product model. When all binding information is exhausted, in block 705, an unknown list may be generated by scanning through the entire product manual structure. The entries in the unknown list are document objects that have not been bound to any physical document files in the document database. Advantageously, the unknown list is used by the author to locate the document objects for which physical document files need to be prepared.

A property-based similarity search is implemented in block 706 to assist the author in identifying existing documents in the document database that may be reused. The property-based similarity search mechanism makes use of the properties of the document object for which a document file is needed, the properties of all physical document files in the document database, and the product information in the product database to determine if a document file is closely related to the document object. When component documents are checked into the document database, the author may manually enter appropriate properties to the document table, or invoke the document property extractor 204 to extract important properties from the documents automatically. When a document object is added to a product manual structure, the author may also specify the characteristics of the document object, based on the information from product development departments. A property-based similarity search mechanism compares the three sets of information: properties of physical document files, properties of document objects and product information. After the property-based similarity search is completed, "similar" document files may be found in the document database. Since all properties and important product information are assigned a weight, comparison results are ranked. The author may selectively review the component documents with higher ranks, and decide whether to reuse any of them. If a document file is to be reused, it is revised in block 707, and checked into the document database. If no similar documents are found, the author will have to create a new document from scratch in block 708. When done, the new document is optionally converted, then checked into the document database. In either case, since new or revised documents have become available, the author can activate the machine-specific binding process again to include the new bindings in the machine-specific configuration specification in block 703.

The process of configuring a multimedia product manual may take some time until all document objects are bound properly, i.e., all the entries in the unknown list have been removed, or the document objects are abstract objects such as chapter, section, etc. that do not have any documents associated with them, or the documents are simply not ready for delivery. In block 709, a machine-specific configuration, including all machine-specific document bindings, is generated and stored to the machine-specific file structure for further processing. During the configuring process, the properties of the document objects and the machine-specific document bindings are revised, and thus, the "property", "binding" and "unknown" sections in the machine-specific configuration specification are also updated.

Figures 8, 9:
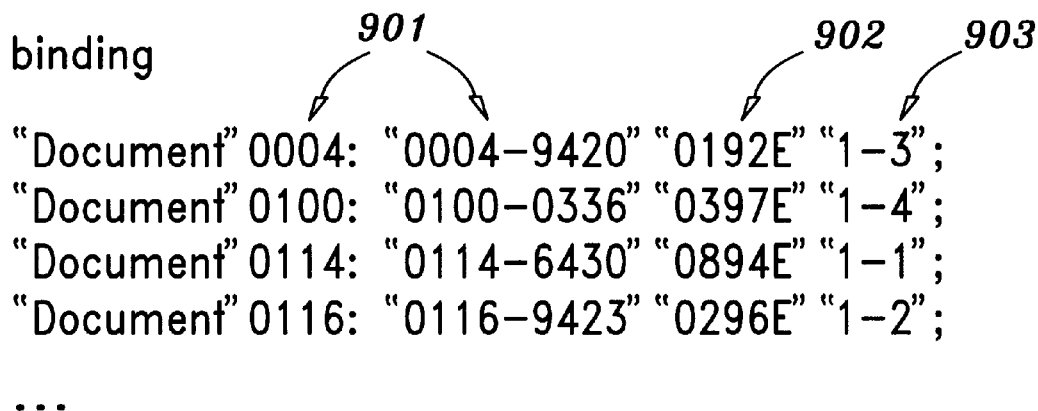
FIG. 8 depicts a property section for a configuration specification in accordance with the present invention.
FIG. 9 depicts a binding section for a configuration specification in accordance with the present invention.

The "property" section includes a list of properties associated with the document objects in the product manual structure. In addition to any product information available from the product database for document objects in a product manual structure, the author may also specify any necessary properties for a document object, based on the information from the product development departments. As an example, the properties of a document object, "Work Sched" 5042, are shown in FIG. 8. To identify a component document in the document database, important properties may include the type of task the document is meant for, (if it is a maintenance document) the work steps that are supposed to be described in the document, the major and minor parts that are supposed to be involved in the document, any schematic diagrams and CAD drawings that are known to be valid for the document, etc. These properties, together with the product information from the product database indicated as "@product_database", form the information for binding a document object to a physical document. The "binding" section keeps track of the binding information between document objects in a product manual structure and the physical documents in the document database. Some examples of document bindings are shown in FIG. 9.

Referring to FIG. 9, a physical document file or a component document in the document table in the document database is identified uniquely by a document id. 901, a date 902 (together with a language id. such as E for English), and the number of pages 903. The "unknown" section includes a list of document objects which have not been bound to any physical documents. The unknown list may be printed out from block 715 (FIG. 7) and examined by the author in the early stage of the product manual composition process to identify the missing documents, and search for similar and reusable documents in the document database, or create new documents from scratch.

Referring again to FIG. 7, a system for generating a machine-specific configuration from the machine-specific manual structure includes the following components. A Model-Specific Document Binder 701 for binding the model-specific document objects in a machine-specific product manual structure to physical document files in the document database. A Machine-Specific Document Generator 702 for extracting the machine-specific product information from the document database and generating machine-specific documents for the document objects in a machine-specific product manual structure. A Machine-Specific Document Binder 703 for binding the machine-specific document objects in a machine-specific product manual structure to physical document files in the document database. A Product Document Promoter 704 for promoting machine-specific documents to be model-specific documents for a product model. A Similar Document Finder 706 for identifying the similarity of the existing documents in the document database and the document objects in a machine-specific product manual structure to determine if the existing documents can be reused for new products. A Configuration Generator 709 for capturing the current state of assembling a machine-specific product manual, and generating a machine-specific configuration to support incremental composition. And, an Unknown List Generator 705 for generating the list of unbound document objects in a machine-specific product manual structure.

Generating a Machine-Specific Product Manual

Figure 10:
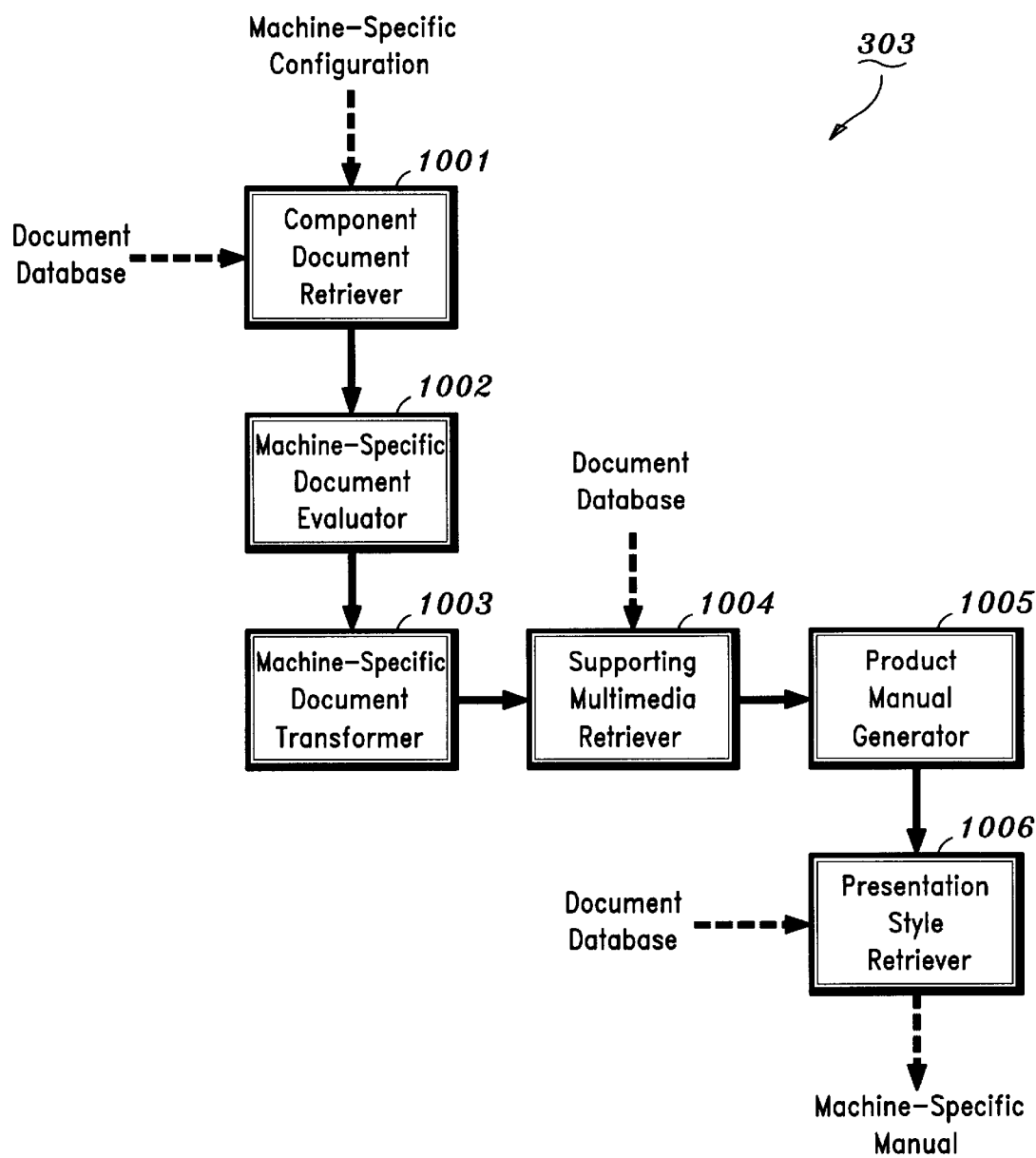
FIG. 10 is a block/flow diagram for generating a machine specific manual in accordance with the present invention.

After all document objects in a product manual structure are bound properly, the process continues with generating a complete multimedia manual for the product as in block 302 of FIG. 3. Referring to FIG. 10, to generate an SGML product manual, in block 1001, all component documents in all media are retrieved from the document database, based on the binding information, and copied to the machine-specific file structure. SGML component documents are copied to various different directories in the machine-specific file structure, based on the delivery model.

SGML-based component documents are generic, i.e., they are created with general product information that is valid for a product model or product family. To incorporate customization information for specific product instances, special tags and attributes are used in the component documents, which are evaluated by the Document Evaluator 206 in block 1002 to convert into the machine-specific documents. There are several levels of product-specific information that can be incorporated in the component documents. In particular, if a component document is valid for a product family, it may include specific information for a group of specific product models in that product family. If a component document is valid for a product model, it may include specific information for a group of product instances of that product model.

Since the component documents that have been prepared in the document database are structured in the most general way solely for the purpose of preserving technical information for the life span of the products. The structures of the component documents may not be completely appropriate for (the presentation of) a specific product manual. In block 1003, the Document Transformer 208 is invoked to transform the structure of the component documents. The Document Transformer 208 supports a specification-based SGML structure transformation, i.e., Document Transformer 208 provides a Document Structure Transformation Specification Language (DSTSL) for the author to specify mapping from the source SGML structure to the target one. The Document Evaluator 206 and Document Transformer 208 are independent tools that may also be invoked on a complete multimedia product manual after it has been composed to evaluate and transform all component documents.

After a component document is evaluated and transformed, it is ready for use in a product manual. In block 1004, the relationships between a component document and all its supporting multimedia files are retrieved from the document database. Depending on the applications, proper versions of the multimedia files are retrieved and copied to various directories in the machine-specific file structure, based on the delivery model. In particular, to support both on-line browsing and high-quality publishing, two versions of images with different resolutions are preferably retrieved into the machine-specific file structure.

When all multimedia product documents are installed properly in the machine-specific file structure, in block 1005, product manual composer 202 invokes product manual generator 212 to generate the top-level SGML documents to complete the product manual. For gas turbines, typical top-level SGML documents are such as the SGML manual structure, table of contents, list of work sequences, list of tables and figures, glossary, index, etc. To prepare the machine-specific file structure for delivery, in block 1006, an SGML declaration file, a default DTD, style sheets for on-line browsing and printing, etc. are also retrieved from the document database and installed in the proper machine-specific directories, based on the delivery model. A multimedia product manual is ready for viewing and further processing.

A system for generating a machine-specific product manual with presentation styles includes the following components. A Component Document Retriever 1001 for retrieving all component documents in all media from the document database, based on a machine-specific configuration, and for storing component documents in the various subdirectories of a machine-specific directory, based on a delivery model. A Document Evaluator 1002 for evaluating the retrieved component documents to convert them into machine-specific documents. A Document Transformer 1003 for transforming the structure of the retrieved component documents into the target document structure for a machine-specific product manual, based on a document structure transformation specification A Supporting Multimedia Retriever 1004 for retrieving all supporting multimedia files associated with the retrieved component documents for a machine-specific product manual. A Machine-Specific Product Manual Generator 1005 for generating the top-level SGML documents to complete a machine-specific product manual, including table of contents, work sequence lists, glossary, index, etc. And, a Presentation Style Retriever 1006 for retrieving presentation styles for a machine-specific product manual structure, based on a delivery model.

Incremental Composition

The product manual composition process keeps track of the configuration of a product manual at the document object level in the configuration specification file and the tables in the document database. Since collecting all documents and engineering data for a new product may take an extended period of time, the present invention supports incremental processing such that a product manual may be incrementally updated, e.g., a new document object may be added, a document object may be moved around in the product manual structure or removed, a document object may be bound or unbound individually, etc. The entries in the unknown list may be examined one by one, and the machine-specific directories that include the machine-specific product manual may be updated incrementally, as new documents are transferred from the document database or existing documents are removed or replaced.

However, when the product manual configuration is changed, the product manual generator 212 often needs to be run again to generate most of the top-level SGML documents to be included in the product manual. If a product manual has been hyperlinked, and a new document is added, or a hyperlinked document is updated, the Hyperlinker may also need to be run again incrementally or completely from scratch, depending on the impact of the new or updated document on the hyperlinked structure.

If a configuration specification includes no customization (i.e. the structure of a machine-specific document is predetermined), editing is unnecessary, then the product manual composition process is run in batch mode to assemble machine-specific documents or perform an update to a single document object. Thus, the product manual composition process can also be invoked automatically for incremental processing by other documentation tools. This advantageously provides a more versatile system and includes the ability to update and maintain documents. The configuration specification supports incremental composition due to its capability of recording up-to-date configuration status of a product manual during assembling.

Although the present disclosure illustratively demonstrates the present invention in terms of a product, other products and services having manual associated therewith may employ the present invention. For example, rule books, instruction manuals, business system documents etc. may employ the present invention.

Having described preferred embodiments for a system and method for automatic assembly of multimedia product manuals (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

What is claimed is:

1. A system for automatically assembling product manuals based on a product model, a delivery model and a formal configuration specification comprising:

a structure instantiator for instantiating a product manual structure from a model-specific configuration specification to create a logical structure for a product manual, the product manual structure incorporating product information from a product model, the product manual structure including document objects;

a manual configurer for configuring the product manual by binding the document objects in the logical structure to proper versions of component documents stored in a document database; and a manual generator for generating the product manual by physically extracting the document objects from the document database to a directory, based on a delivery model; wherein the instantiator further comprises:

a file structure builder for setting up a working environment on a file structure, the file structure including files related to the product which are copied from the document database in accordance with the delivery model;

a configuration template identifier for identifying and retrieving a model-specific configuration template from the document database, the model-specific configuration template for integrating information into a model-specific manual structure for the product manual;

a model-specific manual structure creator for parsing the model-specific manual structure to create an internal structure and for automatically validating the internal structure against product information in a product database;

a machine-specific manual structure creator for creating a machine-specific manual structure by incorporating machine-specific and customer-specific requirements into the model-specific manual structure; and a configuration specification generator for generating a machine-specific configuration specification from the machine-specific manual structure with the properties and binding status of all the document objects.

2. The system as recited in claim 1, wherein the configuration specification includes sections for representing relationships in the logical structure.

3. The system as recited in claim 2, wherein the configuration specification sections include:

a configuration section for specifying the logical structure of the product manual in terms of composition relationships of the document objects.

4. The system as recited in claim 2, wherein the configuration specification sections include:

a work sequence section for specifying a list of operational work steps in terms of composition relationships between work steps.

5. The system as recited in claim 2, wherein the configuration specification sections include:

a property section for specifying characteristics of the document objects in the logical structure.

6. The system as recited in claim 2, wherein the configuration specification sections include:

a binding section for specifying a current binding status between the document objects in the logical structure and physical document files.

7. The system as recited in claim 2, wherein the configuration specification sections include:

an unknown section for specifying unbound document objects and for listing the document objects to identify missing documents and identify a need to create new documents.

8. The system as recited in claim 1, wherein the configuration specification supports incremental composition for updating and maintaining the document objects and the product manual.

9. The system as recited in claim 1, wherein the formal configuration specification includes a product manual configuration specification language (PMCSL).

10. The system as recited in claim 1, wherein the document objects include at least one of drawings, diagrams, text, photographs, video, animation and audio.

11. A system for automatically assembling product manuals based on a product model, a delivery model and a formal configuration specification comprising:

a structure instantiator for instantiating a product manual structure from a model-specific configuration specification to create a logical structure for a product manual, the product manual structure incorporating product information from a product model, the product manual structure including document objects;

a manual configurer for configuring the product manual by binding the document objects in the logical structure to proper versions of component documents stored in a document database; and a manual generator for generating the product manual by physically extracting the document objects from the document database to a directory, based on a delivery model; wherein the manual generator further comprises:

a component document retriever for retrieving the component documents from the document database, based on a machine-specific configuration, and the component document retriever for storing the component documents in various subdirectories of a machine-specific directory, based on the delivery model;

a document evaluator for evaluating the retrieved component documents to convert the retrieved component documents into machine-specific documents;

a document transformer for transforming the structure of the retrieved component documents into a target document structure for the machine-specific product manual, based on a document structure transformation specification;

a supporting multimedia retriever for retrieving multimedia files associated with the retrieved component documents for the machine-specific product manual;

a machine-specific product manual generator for generating top-level standard generalized markup language (SGML) documents to complete the machine-specific product manual, including one or more of a table of contents, work sequence lists, a glossary and an index; and a presentation style retriever for retrieving presentation styles for the machine-specific product manual structure, based on the delivery model.

12. A system for automatically assembling product manuals based on a product model, a delivery model and a formal configuration specification comprising:

a structure instantiator for instantiating a product manual structure from a model-specific configuration specification to create a logical structure for a product manual, the product manual structure incorporating product information from a product model, the product manual structure including document objects;

a manual configurer for configuring the product manual by binding the document objects in the logical structure to proper versions of component documents stored in a document database; and a manual generator for generating the product manual by physically extracting the document objects from the document database to a directory, based on a delivery model; wherein the manual configurer further comprises:

a model-specific document binder for binding model-specific document objects in a machine-specific product manual structure to physical document files in the document database;

a machine-specific document generator for extracting machine-specific product information from the document database and generating machine-specific documents for the document objects in the machine-specific product manual structure;

a machine-specific document binder for binding machine-specific document objects in the machine-specific product manual structure to physical document files in the document database;

a product document promoter for promoting machine-specific documents to model-specific documents for a product model;

a similar document finder for identifying similarities between the documents in the document database and the document objects in a machine-specific product manual structure to determine if the existing documents are reusable;

a configuration generator for capturing a current state of assembling the machine-specific product manual, and generating a machine-specific configuration to support incremental composition; and an unknown list generator for generating a list of unbound document objects in the machine-specific product manual structure.

13. A method for automatically assembling product manuals based on a product model, a delivery model and a formal configuration specification comprising the steps of:

instantiating a product manual structure from a model-specific configuration specification to create a logical structure for a product manual, the product manual structure incorporating the product information from a product model, the product manual structure including document objects;

configuring the product manual by binding the document objects in the logical structure to proper versions of component documents stored in a document database; and generating the product manual by physically extracting the document objects from the document database to a directory, based on a delivery model; wherein the step of generating further comprises the steps of:

retrieving the component documents from the document database, based on a machine-specific configuration, and the component document retriever for storing the component documents in various subdirectories of a machine-specific directory, based on the delivery model;

evaluating the retrieved component documents to convert the retrieved component documents into machine-specific documents;

transforming the structure of the retrieved component documents into a target document structure for the machine-specific product manual, based on a document structure transformation specification;

retrieving multimedia files associated with the retrieved component documents for the machine-specific product manual;

generating top-level standard generalized markup language (SGML) documents to complete the machine-specific product manual, including one or more of a table of contents, work sequence lists, a glossary and an index; and retrieving presentation styles for the machine-specific product manual structure, based on the delivery model.

14. The method as recited in claim 13, wherein the configuration specification includes sections and further comprising the step of representing relationships in the logical structure using the sections.

15. The method as recited in claim 14, further comprising the step of specifying the logical structure of the product manual in terms of composition relationships of the document objects using a configuration section.

16. The method as recited in claim 14, further comprising the step of specifying a list of operational work steps in terms of composition relationships between work steps using a work sequence section.

17. The method as recited in claim 14, further comprising the step of specifying characteristics of the document objects in the logical structure using a property section.

18. The method as recited in claim 14, further comprising the step of specifying a current binding status between the document objects in the logical structure and physical document files using a binding section.

19. The method as recited in claim 14, further comprising the steps of:

specifying unbound document objects using an unknown section; and listing the document objects to identify missing documents and identify a need to create new documents using the unknown section.

20. The method as recited in claim 13, further comprises the step of updating and maintaining the document objects and the product manual.

21. The method as recited in claim 13, wherein the formal configuration specification includes a product manual configuration specification language (PMCSL).

22. The method as recited in claim 13, wherein the document objects include at least one of drawings, diagrams, text, photographs, video, animation and audio.

23. A method for automatically assembling product manuals based on a product model, a delivery model and a formal configuration specification comprising the steps of:

instantiating a product manual structure from a model-specific configuration specification to create a logical structure for a product manual, the product manual structure incorporating the product information from a product model, the product manual structure including document objects;

configuring the product manual by binding the document objects in the logical structure to proper versions of component documents stored in a document database; and generating the product manual by physically extracting the document objects from the document database to a directory, based on a delivery model; wherein the step of configuring further comprises the steps of:

binding model-specific document objects in a machine-specific product manual structure to physical document files in the document database;

extracting machine-specific product information from the document database and generating machine-specific documents for the document objects in the machine-specific product manual structure;

binding machine-specific document objects in the machine-specific product manual structure to physical document files in the document database;

promoting machine-specific documents to model-specific documents for a product model;

identifying similarities between the documents in the document database and the document objects in a machine-specific product manual structure to determine if the existing documents are reusable;

capturing a current state of assembling the machine-specific product manual, and generating a machine-specific configuration to support incremental composition; and generating a list of unbound document objects in the machine-specific product manual structure.

24. A method for automatically assembling product manuals based on a product model, a delivery model and a formal configuration specification comprising the steps of:

instantiating a product manual structure from a model-specific configuration specification to create a logical structure for a product manual, the product manual structure incorporating the product information from a product model, the product manual structure including document objects;

configuring the product manual by binding the document objects in the logical structure to proper versions of component documents stored in a document database; and generating the product manual by physically extracting the document objects from the document database to a directory, based on a delivery model, wherein the step of instantiating farther comprises the steps of:

setting up a working environment on a file structure, the file structure including files related to the product which are copied from the document database in accordance with the delivery model;

identifying and retrieving a model-specific configuration template from the document database, the model-specific configuration template for integrating information into a model-specific manual structure for the product manual;

parsing the model-specific manual structure to create an internal structure and for automatically validating the internal structure against product information in a product database;

creating a machine-specific manual structure by incorporating machine-specific and customer-specific requirements into the model-specific manual structure; and generating a machine-specific configuration specification from the machine-specific manual structure with the properties and binding status of all the document objects.

* * * * *